(12) United States Patent
Sugimoto et al.

(10) Patent No.: US 10,971,334 B2
(45) Date of Patent: Apr. 6, 2021

(54) HIGH FREQUENCY ANTENNA AND PLASMA PROCESSING DEVICE

(71) Applicant: KABUSHIKI KAISHA TOSHIBA, Minato-ku (JP)

(72) Inventors: Yuta Sugimoto, Yokohama (JP); Masashi Yamage, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/797,147

(22) Filed: Feb. 21, 2020

(65) Prior Publication Data
US 2021/0057184 A1    Feb. 25, 2021

(30) Foreign Application Priority Data
Aug. 19, 2019    (JP) .............................. JP2019-149796

(51) Int. Cl.
*H01J 37/32*          (2006.01)

(52) U.S. Cl.
CPC ....... *H01J 37/3211* (2013.01); *H01J 37/3244* (2013.01); *H01J 37/32119* (2013.01); *H01J 2237/334* (2013.01)

(58) Field of Classification Search
CPC ............. H01J 37/3211; H01J 37/32119; H01J 37/3244; H01J 2237/334
See application file for complete search history.

(56) References Cited

U.S. PATENT DOCUMENTS

2010/0066251 A1    3/2010    Nakagami et al.
2012/0073757 A1    3/2012    Yamazawa

FOREIGN PATENT DOCUMENTS

| JP | 2002-217175 A | 8/2002 |
| JP | 2005-135907 A | 5/2005 |
| JP | 2006-221852 A | 8/2006 |
| JP | 5277473 B2 | 8/2013 |
| JP | 5851682 B2 | 2/2016 |
| WO | 03/012821 A2 | 2/2003 |

*Primary Examiner* — Yuechuan Yu
(74) *Attorney, Agent, or Firm* — Oblon, McClelland, Maier & Neustadt, L.L.P.

(57) ABSTRACT

A high-frequency antenna of an embodiment is installed on a window of a chamber, and includes first and second antenna elements and first and second relaying portions. The first antenna element extends over a first angle range in a circumferential direction, and the second antenna element extends in the circumferential direction over a second angle range deviating from the first angle range. The second antenna element is arranged away from the window compared to the first antenna element, and is arranged on the outer peripheral side from the first antenna element. The first relaying portion extends toward the side away from the window from the first antenna element, and the second relaying portion extends toward the outer peripheral side, from the first relaying portion to the second antenna element.

6 Claims, 5 Drawing Sheets

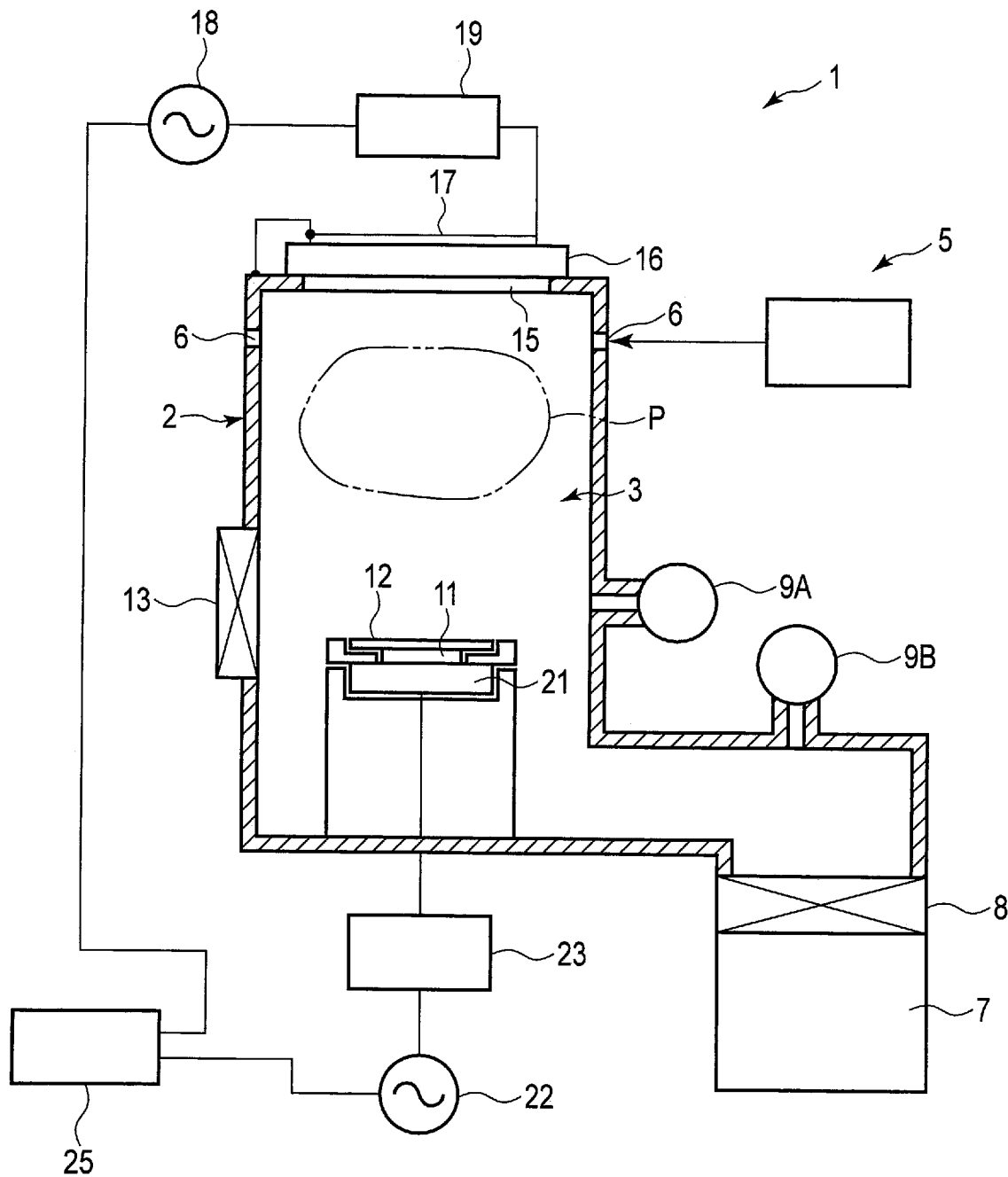
F I G. 1

HIGH FREQUENCY ANTENNA AND PLASMA PROCESSING DEVICE

CROSS-REFERENCE TO RELATED APPLICATIONS

This application is based upon and claims the benefit of priority from Japanese Patent Application No. 2019-149796, filed Aug. 19, 2019, the entire contents of which are incorporated herein by reference.

FIELD

Embodiments described herein relate generally to a high-frequency antenna and a plasma processing device.

BACKGROUND

A plasma processing device may be used to perform etching on a surface of a processing target. As an example of such a plasma processing device, a device that generates inductively coupled plasma is known. In this plasma processing device, a window made of a dielectric or a semiconductor is formed in a chamber, and a high-frequency antenna is provided on the outer surface of the window. A gas is then supplied to a processing space. When a high-frequency current flows in the high-frequency antenna, an induction electric field is generated in the processing space inside the chamber. When the induction electric field is generated in the processing space to which the gas being supplied, plasma is generated in the processing space.

In the above-described plasma processing device that generates inductively coupled plasma, a small-diameter high-frequency antenna having a small dimension in a radial direction may be used. In a small-diameter high-frequency antenna, a ratio, relative to the region dominated by the whole high-frequency antenna, of the region dominated by a feed end and a ground end that do not contribute to axial symmetry of an antenna shape with a central axis as a center, in other words, a ratio of the region dominated by the connecting portions in the high-frequency antenna that are connected to an electric power source and the chamber, becomes large. In the plasma processing device, it has been demanded to secure symmetry of plasma density with the central axis of the high-frequency antenna as the center, even in a case where a small-diameter high-frequency antenna similar to the one described above is used.

BRIEF DESCRIPTION OF THE DRAWINGS

FIG. 1 is a schematic drawing showing a plasma processing device according to a first embodiment.

DETAILED DESCRIPTION

Figure 2:
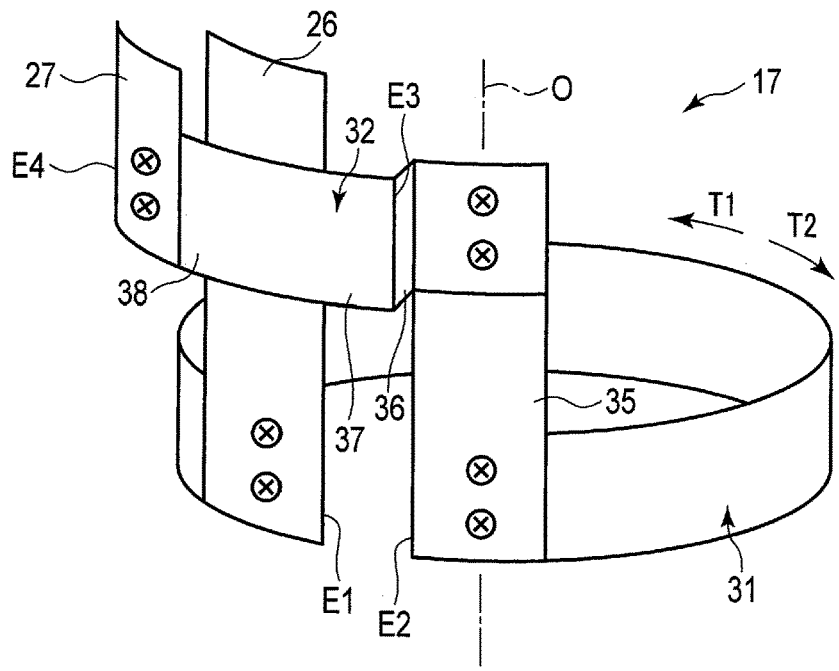
FIG. 2 is a perspective view schematically showing a high-frequency antenna according to the first embodiment.

A high-frequency antenna is provided according to an embodiment. The high-frequency antenna is installed on the outer surface of a window in a chamber where the window is formed. When a high-frequency current flows in the high-frequency antenna, an induction electric field is generated in the processing space inside the chamber, and plasma is generated by the induction electric field in the processing space. The high-frequency antenna includes first and second antenna elements and first and second relaying portions. The first antenna element extends along a circumferential direction over a first angle range in the circumferential direction. The second antenna element extends along the circumferential direction over a second angle range, which deviates from the first angle range in the circumferential direction. The second antenna element is arranged away from the window compared to the first antenna element, and is arranged on the outer peripheral side with respect to the first antenna element. The first relaying portion extends from the first antenna element toward a side away from the window. The second relaying portion extends from the first relaying portion toward the outer peripheral side up to the second antenna element, and is arranged away from the window compared to the first antenna element.

According to an embodiment, a plasma processing device that includes the above-described high-frequency antenna is provided. The plasma processing device includes a chamber, a gas supply source, and an electric power source. The chamber includes a window in which the high-frequency antenna is provided on the outer surface thereof, and a processing space is formed inside the chamber. The gas supply source supplies a gas to the processing space. The electric power source causes a high-frequency current to flow in the high-frequency antenna by supplying high-frequency electric power to the high-frequency antenna, and generates an induction electric field in the processing space. Plasma is generated in the processing space through the generation of the induction electric field in the processing space while the gas is supplied in the processing space.

Hereinafter, the embodiments will be described with reference to the accompanying drawings.

First Embodiment

FIG. 1 shows a plasma processing device 1 according to the first embodiment. As shown in FIG. 1, the plasma processing device 1 includes a chamber 2. The chamber 2 is made of a metal, such as stainless steel or an aluminum alloy, and a processing space 3 is defined in the inside of the chamber 2.

The plasma processing device 1 also includes a gas supply source 5 that supplies a gas (reaction gas) to the processing space 3. In one example, the gas supply source 5 includes a tank (not shown) capable of storing a gas, and a supply driving unit (not shown), such as a pump. In the chamber 2, a gas entrance 6 is formed. Through driving the supply driving unit of the gas supply source 5, the gas in the tank is supplied to the processing space 3 via the gas entrance 6. In another example, an opening/closing valve is provided in a supply path between the gas supply source 5 and the gas entrance 6. The opening/closing valve switches between supply and no supply of a gas to the processing space 3. When such an opening/closing valve is provided, pipes at a factory, etc. may be provided as a gas supply source 5, instead of the tank and the supply driving unit.

The plasma processing device 1 includes a gas exhaust 7 and a pressure adjuster 8. The gas exhaust 7 includes an exhaust driving unit (not shown), such as a vacuum pump, etc. Through driving the exhaust driving unit, the gas in the processing space 3 is evacuated. The evacuated gas from the gas exhaust 7 is collected by a collecting tank (not shown), etc. After a process of rendering the gas harmless in the collecting tank, the gas is released into the atmosphere, for example.

The pressure adjuster 8 includes a pressure control valve, such as an auto pressure controller (APC) valve, and adjusts the pressure of the processing space 3. In one example, through the drive control of the gas exhaust 7 and the pressure adjuster 8, etc., the pressure of the gas (reaction gas) supplied from the gas entrance 6 is adjusted to a value within the range from 0.05 Pa to 500 Pa in the processing space 3. The plasma processing device 1 includes pressure detectors 9A and 9B, such as a pressure sensor, etc. Each of the pressure detectors 9A and 9B detects the pressure in the processing space 3.

In the processing space 3 of the chamber 2, a table 11 is placed vertically below the gas entrance 6. A processing target 12, which is a target to be processed in the plasma processing device 1, is placed on the table 11. The processing target 12 is placed on a surface facing vertically upward in the table 11. In one example shown in FIG. 1, etc., a loading entrance 13 is formed on a sidewall of the chamber 2. The processing target 12 is loaded into and unloaded from the processing space 3 via the loading entrance 13. In a state where later-described processing is performed in the processing space 3, the loading entrance 13 is air-tightly closed by a gate valve (not shown), for example.

In one example, a driving mechanism (not shown) is provided in the plasma processing device 1. In this case, the driving mechanism includes a servo motor or a controller motor, etc. Furthermore, through driving the driving mechanism, the table 11 is moved (for example, rotated). For this reason, in a state where the processing target 12 is placed on the table 11, the processing target 12 moves together with the table 11, when the table 11 is moved.

The processing target 12 is for example a plate-like item, for example a flat plate or a circle plate, but is not limited thereto. The processing target 12 is etched by later-described processing, using plasma. One example of the processing target 12 is a semiconductor wafer on which a resist mask is formed. In this case, an organic component constituting the resist mask is etched by the later-described processing, using plasma.

On the ceiling of the chamber 2, an opening 15 that outwardly opens the processing space 3 toward the outside of the chamber 2 is formed. In the chamber 2, a window 16 is attached so as to close the opening 15. In other words, the window 16 is formed on the ceiling of the chamber 2. The window 16 is made of a dielectric, such as quartz and alumina, etc., or a semiconductor, such as silicon, etc. Furthermore, in the processing space 3, a gas is introduced into a space between the window 16 and the table 11 from the gas entrance 6.

A high-frequency antenna 17 is placed on the outer surface of the window 16. Thus, the high-frequency antenna 17 is arranged at the outside of the chamber 2. The high-frequency antenna 17 is made of a conductive material, for example, and has a feed end and a ground end. The feed end of the high-frequency antenna 17 is connected to a electric power source (high-frequency electric power source) 18, and an adjustment circuit 19 is provided between the high-frequency antenna 17 and the electric power source 18. The ground end of the high-frequency antenna 17 is connected to the chamber 2, and is grounded. The electric power source 18 supplies the high-frequency antenna 17 with a high-frequency electric power at a frequency in the range from a few MHz to a few 100 MHz, and in one example, supplies the high-frequency antenna 17 with a high-frequency electric power at a frequency of 13.56 MHz. The adjustment circuit 19 is a reactance-variable adjustment circuit that adjusts between an impedance on the electric power source 18 side and an impedance on the load side of the high-frequency antenna 17, etc.

In the processing space 3, an electrode (lower electrode) 21 is provided vertically below and adjacent to the table 11. The electrode 21 is made of a conductive material, and has a feed end. The feed end of the electrode 21 is connected to an electric power source (high-frequency electric power source) 22, and an adjustment circuit 23 is provided between the electrode 21 and the electric power source 22. The electrode 21 may optionally include a ground end to be grounded. The electric power source 22 supplies the electrode 21 with a high-frequency electric power at a frequency in the range from a few kHz to a few MHz. The adjustment circuit 23 is a reactance-variable adjustment circuit that adjusts between an impedance on the electric power source 22 side and an impedance on the load side of the electrode 21, etc.

In one example, a temperature adjuster (not shown) for heating and/or cooling the table 11 and the electrode 21 is provided in the plasma processing device 1. In this case, through controlling the operation of the temperature adjuster, the temperature of the table 11 and the electrode 21 is adjusted.

In the example shown in FIG. 1, the plasma processing device 1 includes a controller 25. The controller 25 is a computer, for example. The controller 25 includes a processor or an integrated circuit (control circuit) including a CPU (central processing unit), an ASIC (application specific integrated circuit), or an FPGA (field programmable gate array), and a storage medium, such as a memory. The controller 25 may include only one integrated circuit, etc., or a plurality of integrated circuits, etc. The controller 25 performs processing by executing a program, etc. stored on the storage medium, etc. The controller 25 controls the output of the high-frequency electric power from each of the electric power sources 18 and 22. The frequency and phase, etc. of the high-frequency electric power output from each of the electric power sources 18 and 22 are thus adjusted. The output of the electric power sources 18 and 22 is mutually independently controlled by the controller 25.

Through the supply of high-frequency electric power from the electric power source 18 to the high-frequency antenna 17 and the flow of the high-frequency current in the high-frequency antenna 17, a magnetic field is induced in an area in the vicinity of the high-frequency antenna 17. Then, as the induced magnetic field changes over time, the induction electric field is generated in the processing space 3 so as to cancel the change in the magnetic field. At this time, an induction electric field is generated between the window 16 and the table 11 in the processing space 3.

Through the generation of the induction electric field in the processing space 3 while a gas is being supplied from the gas supply source 5 to the processing space 3, the supplied gas is energized and ionized in the processing space 3.

Plasma P is thereby generated in the processing space 3. Through the use of the generated plasma P, the processing target 12 is then processed by etching for example. Since the plasma P is generated in the above-described manner, inductively coupled plasma is generated in the present embodiment.

In the plasma processing device 1, in a state where high-frequency electric power is supplied to the high-frequency antenna 17 so that the plasma P is generated in the processing space 3 as described above, the high-frequency electric power may be supplied from the electric power source 22 to the electrode 21. In this case, the controller 25 adjusts the frequency and the phase, etc. of the high-frequency electric power output from each of the electric power sources 18 and 22, and ion energy entered into the processing target 12 is thereby controlled. At this time, the frequency and the phase, etc. of the high-frequency electric power output from each of the electric power sources 18 and 22 is adjusted by the controller 25 in such a manner that ion energy of the ionized gas is appropriately entered into the processing target 12.

Figure 3:
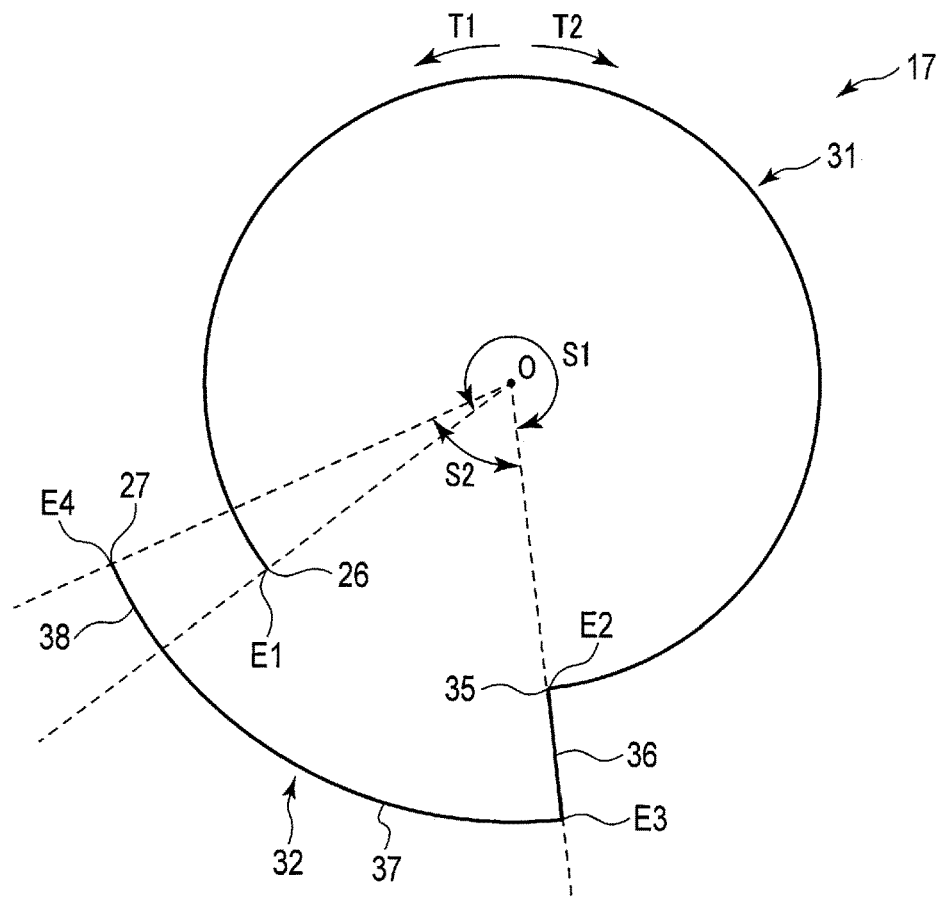
FIG. 3 is a schematic drawing showing the high-frequency antenna of FIG. 2 when viewed from one side of a direction along a center axis.
Figure 4:
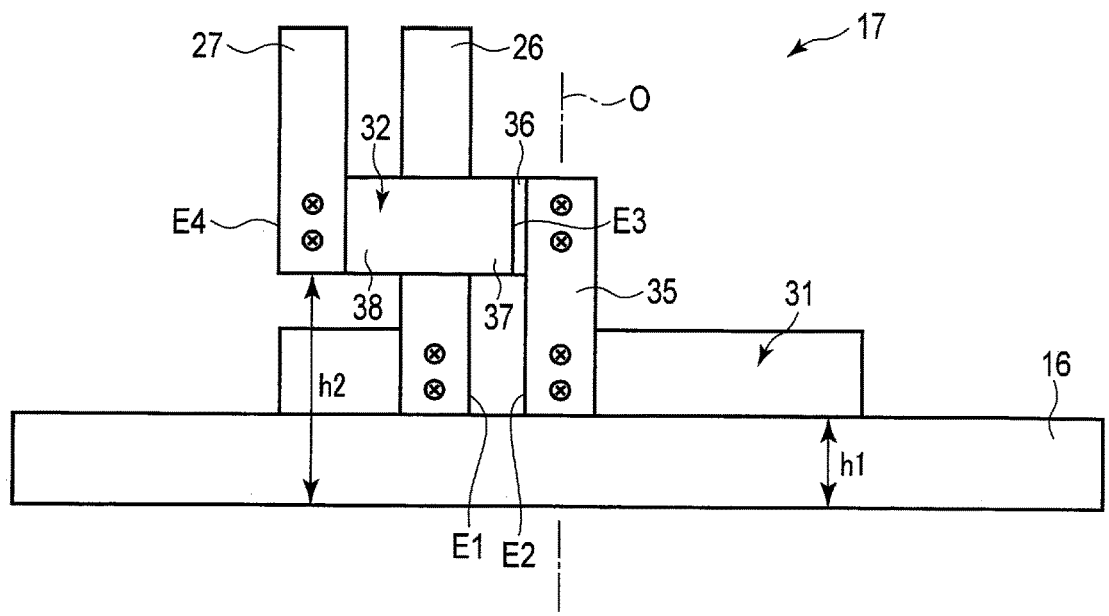
FIG. 4 is a schematic drawing showing the high-frequency antenna of FIG. 2 when viewed from an outer peripheral side.

FIGS. 2 through 4 show the high-frequency antenna 17 of the present embodiment. As shown in FIGS. 2 through 4, the high-frequency antenna 17 has a central axis O. In the plasma processing device 1, the central axis O of the high-frequency antenna 17 intersects with (is perpendicular or substantially perpendicular to) the inner and outer surfaces of the window 16. In the high-frequency antenna 17, the circumferential direction (the direction indicated by arrows T1 and T2), which is a direction around the central axis O, is defined. In the high-frequency antenna 17, the side closer to the central axis O in the radial direction is defined as an inner peripheral side, and the side away from the central axis O in the radial direction is defined as an outer peripheral side. FIG. 3 shows the high-frequency antenna 17 viewed from one side of a direction along the central axis O, and FIG. 4 shows the high-frequency antenna 17 viewed from the outer peripheral side.

In the high-frequency antenna 17, one side of a direction along the central axis O is the side closer to the window 16, in other words, a near side with respect to the window 16. Furthermore, in the high-frequency antenna 17, the other side of a direction along the central axis O is the side away from the window 16, in other words, a far with respect to the window 16. The high-frequency antenna 17 includes a feed end piece 26 that constitutes the foregoing feed end, and a ground end piece 27 that constitutes the foregoing ground end. The high-frequency antenna 17 includes antenna elements 31 and 32, and relaying portions 35 and 36. In the high-frequency antenna 17, the antenna elements 31 and 32 are relayed by the relaying portions 35 and 36.

The antenna element (first antenna element) 31 includes an extended end (first extended end) E1, and an extended end (second extended end) E2 provided on the opposite side of the extended end E1. The antenna element 31 continuously extends along the circumferential direction, in other words, along the direction around the central axis O, from the extended end E1 to the extended end E2. For this reason, the antenna element 31 continuously extends over an angle range (first angle range) S1 between the extended end E1 and the extended end E2. The antenna element 31 is connected to the feed end piece 26 in the extended end E1. The feed end piece 26 extends in the direction along the central axis O, from the extended end E1 of the antenna element 31 toward the side away from the window 16.

The antenna element (second antenna element) 32 includes an extended end (third extended end) E3, and an extended end (fourth extended end) E4 provided on the opposite side of the extended end E3. The antenna element 32 continuously extends along the circumferential direction, in other words, along the direction around the central axis O, from the extended end E3 to the extended end E4. For this reason, the antenna element 32 continuously extends over an angle range (second angle range) S2 between the extended end E3 and the extended end E4. The antenna element 32 is connected to the ground end piece 27 in the extended end E4. The ground end piece 27 extends in the direction along the central axis O, from the extended end E4 of the antenna element 32 toward the side away from the window 16.

In the high-frequency antenna 17, the angle range (second angle range) S2 in which the antenna element (second antenna element) 32 extends deviates from the angle range (first angle range) S1 in which the antenna element (first antenna element) 31 extends, according to the circumferential direction. In the present embodiment, the angle range S2 partially overlaps the angle range S1, and the non-overlapping part of the angle range S2 falls outside of the angle range S1. For this reason, the antenna element (second antenna element) 32 includes an extending portion (first extending portion) 37 extending in the angle range S2 but in a region outside the angle range S1, and an extending portion (second extending portion) 38 extending in a region overlapping the angle range S1 within the angle range S2.

Furthermore, in the present embodiment, the angle range (first angle range) S1 in which the antenna element 31 extends is larger than the angle range (second angle range) S2 in which the antenna element 32 extends. In one example, the angle range S1 is larger than 270 degrees, and the angle range S2 is smaller than 90 degrees. In either case, each of the angle range S1 and the angle range S2 is smaller than 360 degrees. For this reason, each of the antenna elements 31 and 32 extends only in a partial range, not for the entire perimeter, in the circumferential direction.

The antenna element (second antenna element) 32 is arranged away from the window 16, compared to the antenna element (first antenna element) 31, according to a direction along the central axis O. In other words, the antenna element 32 is arranged at a position far from the window 16, compared to the position of the antenna element 31. The antenna element (second antenna element) 32 and the ground end piece 27 are arranged on the outer peripheral side with respect to the antenna element (first antenna element) 31 and the feed end piece 26. For this reason, the distance from the central axis O to the antenna element 32 is larger than the distance from the central axis O to the antenna element 31.

The antenna element (first antenna element) 31 is connected to the relaying portion (first relaying portion) 35 in the extended end (second extended end) E2. The relaying portion 35 extends in the direction along the central axis O, from the extended end E2 of the antenna element 31 toward the side away from the window 16. Accordingly, the relaying portion 35 is connected to the extended end E2 of the antenna element 31 at one end, namely the end on the near side from the window 16.

The antenna element (second antenna element) 32 is connected to the relaying portion (second relaying portion) 36 in the extended end (third extended end) E3. The relaying portion 35 is connected to the relaying portion 36 at the end on the far side from the window 16. Then, the relaying portion 36 extends in the radial direction toward the outer peripheral side, from the relaying portion 35 to the antenna element 32. For this reason, the relaying portion 36 is connected to the relaying portion 35 at the inner peripheral end, which is one of the ends. Then, the relaying portion 36 is connected to the antenna element 32 at the outer peripheral end, which is the other end. The relaying portion (second relaying portion) 36 is arranged away from the window 16, compared to the antenna element (first antenna element) 31, according to a direction along the central axis O. In other words, the relaying portion 36 is arranged at a position far from the window 16, compared to the position of the antenna element 31.

In the present embodiment, the angle position of the extended end (second extended end) E2 of the antenna element (first antenna element) 31 is the same or substantially the same as the angle position of each of the relaying portion 35 and 36 and the extended end (third extended end) E3 of the antenna element (second antenna element) 32. In other words, the extended end E2 of the antenna element 31, the relaying portions 35 and 36, and the extended end E3 of the antenna element 32 are not or almost not at all misaligned with respect to each other in the circumferential direction, namely the direction around the central axis O.

In the present embodiment, in the antenna element 32, the extending portion (first extending portion) 37 constitutes the extended end E3, and the extending portion (second extending portion) 38 constitutes the extended end E4. For this reason, in the antenna element 32, the extending portion 37 is connected to the relaying portion 35, and the extending portion 38 is connected to the ground end piece 27. For this reason, the extending portion (second extending portion) 38 is away from the relaying portion 36 (relaying portion 35) in the circumferential direction, compared to the extending portion (first extended portion) 37.

The high-frequency antenna 17 extends from the extended end E1 of the antenna element 31 to the extended end E4 of the antenna element 32, going around from the end to the end more than once in the circumferential direction. In other words, the number of times the extending portion goes around from the extended end E1 of the antenna element 31 to the extended end E4 of the antenna element 32 according to the circumferential direction is once or more. In the present embodiment, however, the number of times the extending portion goes around from the extended end E1 to the extended end E4 in the circumferential direction of the extending portion is one and a half times or less. With the above-described configuration, in the present embodiment, the number of turns of the high-frequency antenna 17, namely the number of loops formed in the high-frequency antenna 17, is 1. Since the number of turns of the high-frequency antenna 17 is small, the high-frequency antenna 17 is formed with a small diameter in the present embodiment.

In the plasma processing device 1 according to the present embodiment, the density distribution of plasma in the processing space 3 is dependent on an intensity distribution of the above-described induction electric field generated in the processing space 3. Furthermore, the intensity distribution of the induction electric field in the processing space 3 varies in correspondence to the shape and dimension of the high-frequency antenna 17, and the position relationship between the high-frequency antenna 17 and the window 16, etc. Particularly, the shapes, the dimensions and the position relationships relative to the window 16 of the antenna elements 31 and 32 and the relaying portion 36 affect the intensity distribution of the induction electric field in the processing space 3, and the density distribution of plasma in the processing space 3.

The direction in which each of the antenna elements 31 and 32 and the relaying portion 36 extends intersects with (is perpendicular or substantially perpendicular to) the central axis O. Thus, the dimensions and shapes, etc., of the portions extending in a direction intersecting with (perpendicular or substantially perpendicular to) the central axis O in the high-frequency antenna 17 affect the intensity distribution of the induction electric field in the processing space 3 and the density distribution of plasma in the processing space 3. Each of the feed end piece 26, the ground end piece 27, and the relaying portion 35 extends along the central axis O. For this reason, the dimension and shape, etc. of each of the feed end piece 26, the ground end piece 27, and the relaying portion 35 almost do not affect at all the intensity distribution of the induction electric field in the processing space 3 and the density distribution of plasma in the processing space 3.

Herein, an element vector V1 of the antenna element (first antenna element) 31, an element vector V2 of the antenna element (second antenna element) 32, and an element vector V3 of the relaying portion (second relaying portion) 36 are defined. Each of the element vectors V1 through V3 is a vector defined on a plane perpendicular to the central axis O, and is a position vector having the central axis O as a starting point. In the following, the element vectors V1 through V3 will be explained.

Figure 5:
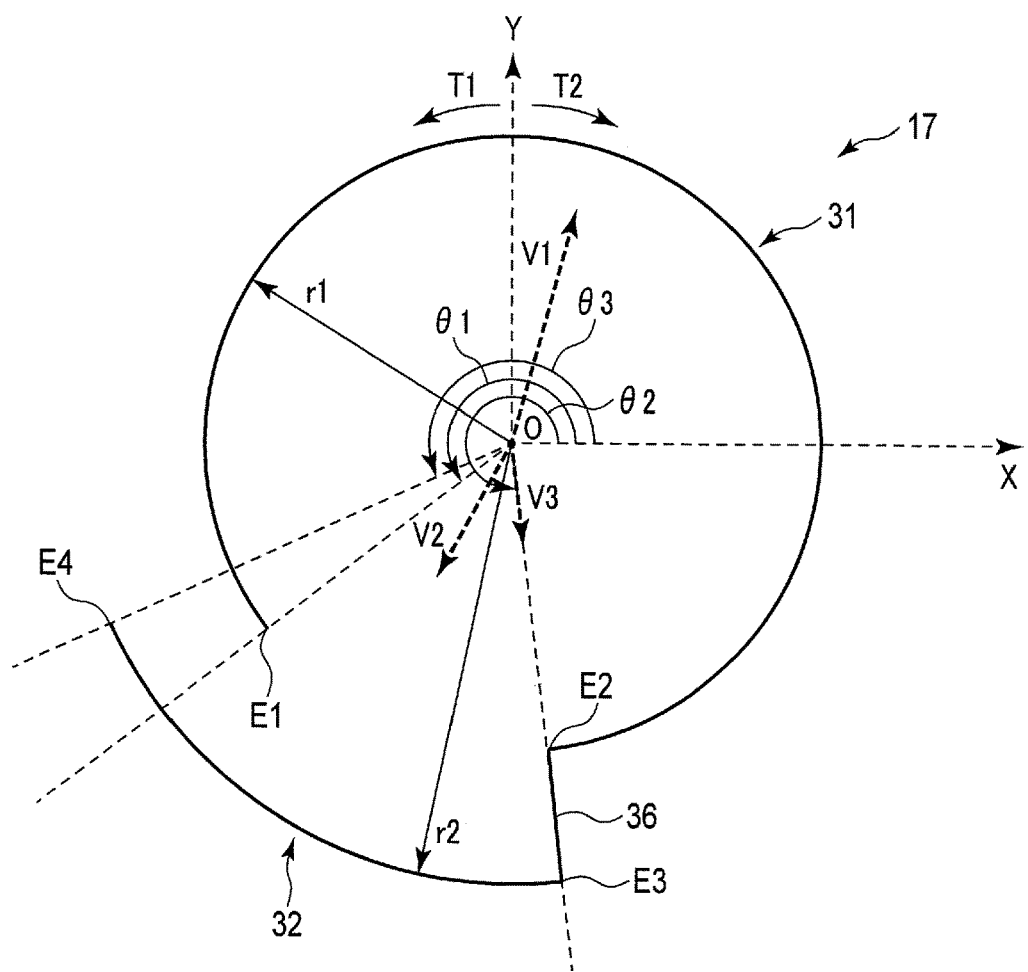
FIG. 5 is a schematic drawing explaining parameters used for calculation of three element vectors in the high-frequency antenna of FIG. 2.

FIG. 5 explains parameters used for calculation of three element vectors V1 through V3. As shown in FIG. 5, in the calculation of the element vectors V1 through V3, an X axis and a Y axis are defined in the plane perpendicular to the central axis O. In the example shown in FIG. 5, the X axis and the Y axis are defined in such a manner that the central axis O serves as an origin where the X axis and the Y axis intersect, and the angle around the central axis O from the positive direction of the X axis and to the positive direction of the Y axis is 90 degrees. Furthermore, the angle around the central axis O from the positive direction of the X axis to the extended end (first extended end) E1 of the antenna element (first antenna element) 31 is defined as $\theta 1$. The angle around the central axis O from the positive direction of the X axis to the extended end (second extended end) E2 of the antenna element 31, the extended end (third extended end) E3 of the antenna element (second antenna element) 32, and the relaying portion 36 is defined as $\theta 2$. Furthermore, the angle around the central axis O from the positive direction of the X axis to the extended end (fourth extended end) E4 of the antenna element 32 is defined as $\theta 3$.

The distance in a radial direction from the central axis O to the antenna element (first antenna element) 31 and the inner peripheral end of the relaying portion 36 is defined as r1. Furthermore, the distance in a radial direction from the central axis O to the antenna element (second antenna element) 32 and the outer peripheral end of the relaying portion 36 is defined as r2. As shown in FIG. 4, the distance in a direction along the central axis O, from the inner surface of the window 16 to the antenna element (first antenna element) 31 is defined as h1. The distance in a direction along the central axis O, from the inner surface of the window 16 to the antenna element (second antenna element) 32 and the relaying portion 36 is defined as h2. A unit vector u1 of the element vector V1, a unit vector u2 of the element vector V2, and a unit vector u3 of the element vector V3 are expressed as shown below, using the above-explained parameters. In the expressions (1) to (3) below, the unit vectors u1 through u3 are represented by position vectors having the origin (central axis O) as a starting point in the X-Y coordinate.

$$u1 = \left(-\cos\left(\frac{\theta 1 + \theta 2}{2}\right), -\sin\left(\frac{\theta 1 + \theta 2}{2}\right)\right) \quad (1)$$

$$u2 = \left(\cos\left(\frac{\theta 2 + \theta 3}{2}\right), \sin\left(\frac{\theta 2 + \theta 3}{2}\right)\right) \quad (2)$$

$$u3 = (\cos\theta 2, \sin\theta 2) \quad (3)$$

To calculate the magnitude |V1| of the element vector V1, an extension length L1 between the extended ends E1 and E2 of the antenna element (first antenna element) 31, and a distance d1 from the central axis O (the origin) to the barycenter of the antenna element 31 in the X-Y coordinate are used. Similarly, to calculate the magnitude |V2| of the element vector V2, an extension length L2 between the extended ends E3 and E4 of the antenna element (second antenna element) 32, and a distance d2 from the central axis O (the origin) to the barycenter of the antenna element 32 in the X-Y coordinate are used. To calculate the magnitude |V3| of the element vector V3, an extension length L3 between the inner peripheral end and the outer peripheral end of the relaying portion 36, and a distance d3 from the central axis O (the origin) to the barycenter of the relaying portion 36 in the X-Y coordinate are used. The extension lengths L1 through L3 and the distances d1 through d3 are expressed using the above-explained parameters as shown below:

$$L1 = r1(\theta 1 - \theta 2 + 2\pi) \quad (4)$$

$$L2 = r2(\theta 2 - \theta 3) \quad (5)$$

$$L3 = r2 - r1 \quad (6)$$

$$d1 = \frac{2r1}{\theta 2 - \theta 1}\sin\left(\frac{\theta 2 - \theta 1}{2}\right) \quad (7)$$

$$d2 = \frac{r2}{\theta 2 - \theta 3}\sin\left(\frac{\theta 2 - \theta 3}{2}\right) \quad (8)$$

$$d3 = \frac{r1 + r2}{2} \quad (9)$$

The magnitude |V1| of the element vector V1 is calculated using the extension length L1 and the distance d1 as shown below. Similarly, the magnitude |V2| of the element vector V2 is calculated using the extension length L2 and the distance d2 as shown below, and the magnitude |V3| of the element vector V3 is calculated using the extension length L3 and the distance d3 as shown below.

$$|V1| = A * L1 * d1 = 2Ar1^2 \frac{\theta 1 - \theta 2 + 2\pi}{\theta 2 - \theta 1}\sin\left(\frac{\theta 2 - \theta 1}{2}\right) \quad (10)$$

$$|V2| = \frac{h1^2}{h2^2} * A * L2 * d2 = \frac{h1^2}{h2^2}\sin\left(\frac{\theta 2 - \theta 3}{2}\right) \quad (11)$$

$$|V3| = \frac{h1^2}{h2^2} * A * L3 * d3 = \frac{h1^2}{h2^2} A \frac{r2^2 - r1^2}{2} \quad (12)$$

The element vector V1 is expressed using Expressions (1) and (10) as shown below. Similarly, the element vector V2 is expressed using Expressions (2) and (11) as shown below, and the element vector V3 is expressed using Expressions (3) and (12) as shown below.

$$V1 = \left(-Ar1^2 \frac{\theta 1 - \theta 2 + 2\pi}{\theta 2 - \theta 1}(\sin\theta 2 - \sin\theta 1), \right. \quad (13)$$

$$\left. -Ar1^2 \frac{\theta 1 - \theta 2 + 2\pi}{\theta 2 - \theta 1}(\cos\theta 1 - \cos\theta 2)\right)$$

$$V2 = \left(\frac{h1^2}{2h2^2}Ar2^2(\sin\theta 2 - \sin\theta 3), \frac{h1^2}{2h2^2}Ar2^2(\cos\theta 3 - \cos\theta 2)\right) \quad (14)$$

$$V3 = \left(\frac{h1^2}{h2^2}A\frac{r2^2 - r1^2}{2}\cos\theta 2, \frac{h1^2}{h2^2}A\frac{r2^2 - r1^2}{2}\sin\theta 2\right) \quad (15)$$

Herein, in Expressions (10) through (15), A is a constant. In one example, plasma P is generated in the processing space 3 as described above in such a manner that the parameters of the angles θ1 through θ3 and the distances r1, r2, h1, h2, etc. are discretionarily-determined values, and the processing target 12 is etched using the plasma P. A distribution of etching rate in the processing target 12 is then obtained. Thereafter, the constant A is set in such a manner that the position of a resultant of the element vectors V1 through V3 in the X-Y coordinate matches or substantially matches the point where the etching rate is the highest in the processing target 12. The constant A is set to 1.0, for example.

In the high-frequency antenna 17, the parameters of the angles θ1 through θ3 and the distances r1, r2, h1, h2, etc. are set in such a manner that a resultant of the element vectors V1 through V3 becomes zero or substantially zero. In other words, the resultant of the element vectors V1 through V3 becomes a zero vector or almost a zero vector. In the X-Y coordinate, the resultant of the element vectors V1 through V3 is located on the central axis O (the origin), or at a position slightly deviated from the central axis O.

As described above, in the present embodiment, the number of turns in the high-frequency antenna 17 is small, and the high-frequency antenna 17 has a small diameter. In the present embodiment, however, the antenna element (first antenna element) 31 extends over the angle range (first angle range) S1, and the antenna element (second antenna element) 32 extends over the angle range (second angle range) S2, which deviates from the angle range S1. The antenna element 32 is arranged far away from the window 16 compared to the antenna element 31, and is arranged on the outer peripheral side with respect to the antenna element 31. Furthermore, the relaying portion (first relaying portion) 35 extends from the antenna element 31 toward the side away from the window 16, and the relaying portion (second relaying portion) 36 extends toward the outer peripheral side, from the relaying portion 35 to the antenna element 32.

With such a configuration, it is possible to make the magnitude of the resultant of the element vectors V1 through V3 zero or substantially zero through adjusting the shapes and dimensions of the antenna elements 31 and 32 and the relaying portion 36, and the positions thereof with respect to the window 16. In other words, through the adjustment of the parameters of the angles θ1 through θ3 and the distances r1, r2, h1, h2, etc., it is possible to make the magnitude of the resultant of the element vectors V1 through V3 zero or substantially zero.

Since the magnitude of the resultant of the element vectors V1 through V3 becomes zero or substantially zero, the strength of the above-described induction electric field generated in the processing space 3 becomes symmetric or substantially symmetric with the central axis O of the high-frequency antenna 17 as a center. Thus, the density of plasma P in the processing space 3 becomes symmetric or substantially symmetric with the central axis O of the high-frequency antenna 17 as the center. Therefore, in the present embodiment, the symmetry of the plasma density with the central axis O as the center in the processing space 3 can be secured even when a small-diameter high-frequency antenna 17 is used.

Through securing symmetry of the plasma density as described above, the point where the etching rate is the highest is not or almost not misaligned from the central axis O of the high-frequency antenna 17 during the etching process performed on the processing target 12 using plasma. It is thereby possible to secure performance in the processing using plasma P, such as etching of the processing target 12, etc.

(Modifications)

In one modification, the extended end (first extended end) E1 of the antenna element (first antenna element) 31 is connected to the ground end piece 27, and the ground end piece 27 extends in the direction along the central axis O, from the extended end E1 of the antenna element 31 toward the side away from the window 16. Furthermore, the extended end (fourth extended end) E4 of the antenna element (second antenna element) 32 is connected to the feed end piece 26, and the feed end piece 26 extends in the direction along the central axis O, from the extended end E3 of the antenna element 32 toward the side away from the window 16.

Figure 6:
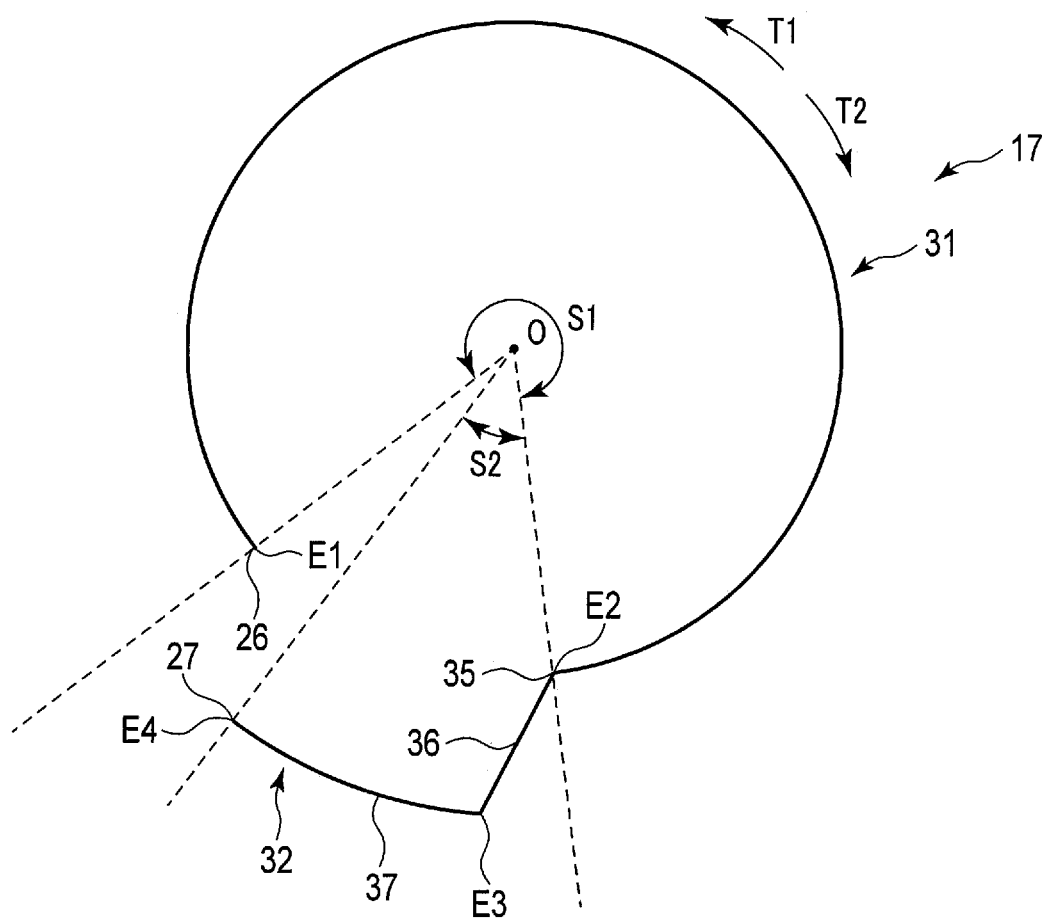
FIG. 6 is a schematic drawing showing a high-frequency antenna according to a modification when viewed from one side of a direction along a center axis.

In the modification shown in FIG. 6, the angle position of the extended end (third extended end) E3 of the antenna element (second antenna element) 32 deviates from the angle position of each of the relaying portion 35 and the extended end (second extended end) E2 of the antenna element (first antenna element) 31. In other words, the extended end E3 of the antenna element 32 becomes misaligned from the extended end E2 of the antenna element 31 and the relaying portion (first relaying portion) 35 in the circumferential direction, in other words, in the direction around the central axis O. Also in the present modification, the relaying portion (first relaying portion) 35 is connected to the extended end E2 of the antenna element (first antenna element) 31, and the relaying portion 35 extends in the direction along the central axis O, from the extended end E2 of the antenna element 31 toward the side away from the window 16. Then, the relaying portion (second relaying portion) 36 is connected to the extended end E3 of the antenna element (second antenna element) 32, and the relaying portion 36 extends toward the outer peripheral side, from the relaying portion 35 to the antenna element 32.

In the present modification, the whole angle range (second angle range) S2 in which the antenna element (second antenna element) 32 extends falls outside of the angle range (first angle range) S1 in which the antenna element (first antenna element) 31 extends. Accordingly, in the present modification, the antenna element 32 exclusively consists of the extending portion 37 extending in a region out of the angle range S1. Even in the present modification, the angle range (second angle range) S2 deviates from the angle range (first angle range) S1 according to the circumferential direction.

Even in the present modification, as defined in the foregoing embodiment, etc., it is possible to define the element vector V1 of the antenna element 31, the element vector V2 of the antenna element 32, and the element vector V3 of the relaying portion 36. Furthermore, it is possible to make the magnitude of the resultant of the element vectors V1 through V3 zero or substantially zero through adjusting the shapes and dimensions of the antenna elements 31 and 32 and the relaying portion 36, and the positions thereof with respect to the window 16. Accordingly, operations and advantageous effects similar to those of the foregoing embodiment, etc. are achieved in the present modification.

In the modification of FIG. 6, the extended end E1 of the antenna element 31 is connected to the feed end piece 26, and the extended end E4 of the antenna element 32 is connected to the ground end piece 27. In another modification, however, the extended end E1 of the antenna element 31 may be connected to the ground end piece 27, and the extended end E4 of the antenna element 32 may be connected to the feed end piece 26.

Figure 7:
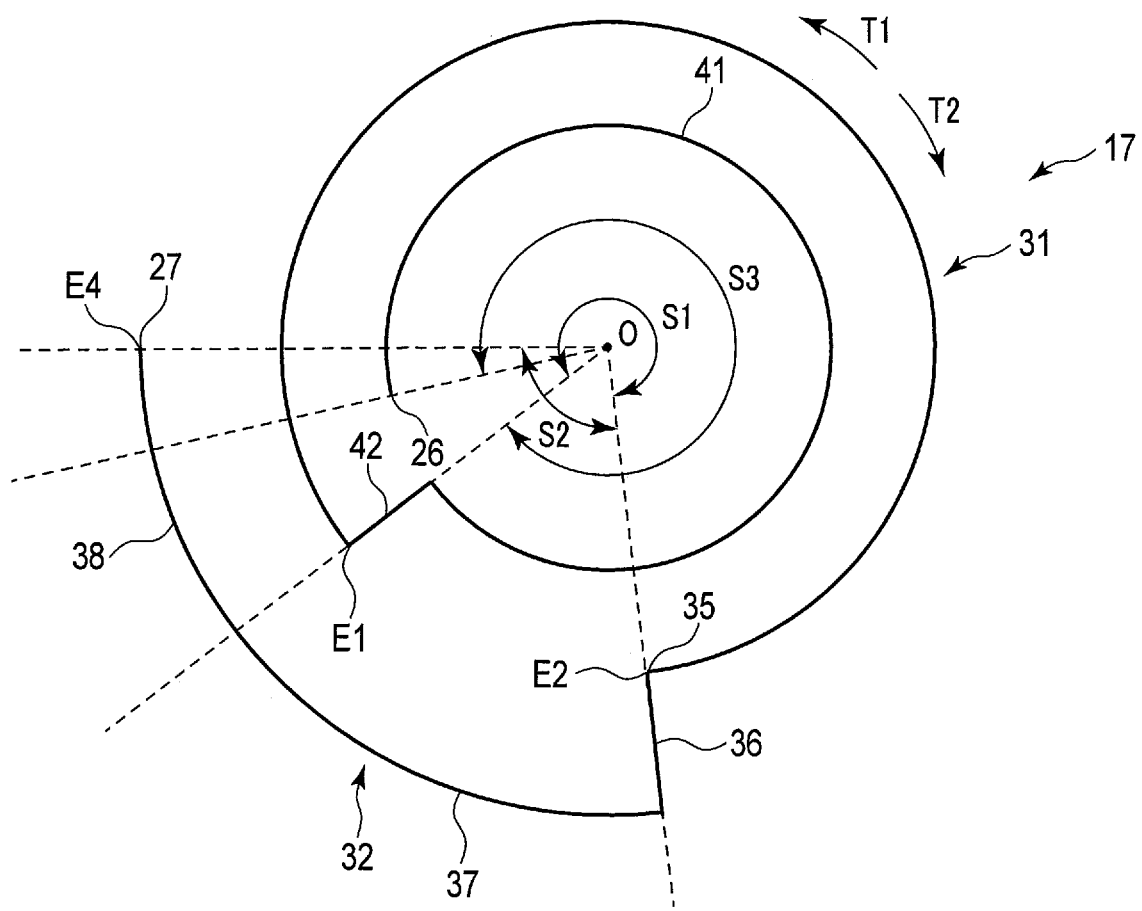
FIG. 7 is a schematic drawing showing a high-frequency antenna according to another modification differing from the one shown in FIG. 6, when viewed from one side of a direction along a center axis.

In the modification shown in FIG. 7, similarly to the first embodiment shown in FIGS. 2 through 4, the ground end piece 27, the antenna elements 31 and 32, and the relaying portions 35 and 36 are formed. In the present modification, however, the antenna element (third antenna element) 41 and the relaying portion (third relaying portion) 42 are provided in the high-frequency antenna 17.

The antenna element 41 continuously extends along the circumferential direction, in other words, along the direction around the central axis O, from one end to the other end. Furthermore, the antenna element 41 continuously extends over an angle range (third angle range) S3 between one end and the other end, according to the circumferential direction. In the present modification, one end of the antenna element 41 is connected to the feed end piece 26. Furthermore, the feed end piece 26 extends in the direction along the central axis O, from the antenna element 41 toward the side away from the window 16.

In the high-frequency antenna 17 of the present modification, the angle range (third angle range) S3 in which the antenna element (third antenna element) 41 extends deviates from the angle range (first angle range) S1 in which the antenna element (first antenna element) 31 extends, and the angle range (second angle range) S2 in which the antenna element (second antenna element) 32 extends, according to the circumferential direction. Furthermore, the angle range S3 partially overlaps the angle range S1, and the non-overlapping part of the angle range S3 falls outside of the angle range S1. The angle range S3 partially overlaps the angle range S2, and the non-overlapping part of the angle range S3 falls outside of the angle range S2. In the present modification, the angle range (third angle range) S3 in which the antenna element 41 extends is larger than the angle range (second angle range) S2 in which the antenna element 32 extends. For example, the angle range S3 is larger than 270 degrees. In either case, the angle range S3 is smaller than 360 degrees.

The distance from the window 16 to the antenna element 41 in a direction along the central axis O is the same or substantially the same as the distance from the window 16 to the antenna element 31. For this reason, the antenna element 41 is arranged on a side closer to the window 16 than the antenna element 32 and the relaying portion 36, in a direction along the central axis O. The antenna element 41 is arranged on the inner peripheral side with respect to the antenna elements 31 and 32.

The extended end E1 of the antenna element 31 is connected to the relaying portion (third relaying portion) 42. Then, the antenna element 41 is connected to the relaying portion 42 at the opposite end of the end connected to the feed end piece 26. For this reason, the relaying portion 42 is connected to the antenna element 41 on the inner peripheral end, which is one end, and is connected to the antenna element 31 on the outer peripheral end, which is the other end. The relaying portion 42 extends in the radial direction toward the outer peripheral side, from the antenna element 41 to the antenna element 31. The distance from the window 16 to the relaying portion 42 in the direction along the central axis O is the same or substantially the same as the distance from the window 16 to the antenna element 31. For this reason, the relaying portion 42 is arranged on a side closer to the window 16 than the antenna element 32 and the relaying portion 36, according to the direction along the central axis O.

Since the antenna element 41 and the relaying portion 42 are provided as described above, the number of times the extending portion goes around from the end in the antenna element 41 connected to the feed end piece 26 to the extended end E4 of the antenna element 32 in the circumferential direction is twice or more in the present modification. In the present modification, however, the number of times the extending portion goes around from the end in the antenna element 41 connected to the feed end piece 26 to the extended end E4 in the circumferential direction is two and a half times or less. With the above-described configuration, in the present modification, the number of turns of the high-frequency antenna 17, namely the number of loops formed in the high-frequency antenna 17 is 2. Also in the present modification, the number of turns of the high-frequency antenna 17 is small, and the high-frequency antenna 17 is formed with a small diameter.

Even in the present modification, as defined in the foregoing embodiment, etc., it is possible to define the element vector V1 of the antenna element 31, the element vector V2 of the antenna element 32, and the element vector V3 of the relaying portion 36. Furthermore, in the present modification, it is possible to define the element vector V4 of the antenna element 41, and the element vector V5 of the relaying portion 42. In the present modification, since the magnitude of the resultant of the element vectors V1 through V5 becomes zero or substantially zero, the strength of the above-described induction electric field generated in the processing space 3 becomes symmetric or substantially symmetric with the central axis O of the high-frequency antenna 17 as a center, and the density of plasma P in the processing space 3 becomes symmetric or substantially symmetric with the central axis O of the high-frequency antenna 17 as the center.

In the present modification, it is possible to make the magnitude of the resultant of the element vectors V1 through V5 zero or substantially zero through adjusting the shapes and dimensions of the antenna elements 31, 32, and 41 and the relaying portions 36 and 42, and the positions thereof with respect to the window 16. Accordingly, operations and advantageous effects similar to those of the foregoing embodiment, etc. are achieved in the present modification.

In the modification of FIG. 7, one of the ends of the antenna element 41 is connected to the feed end piece 26, and the extended end E4 of the antenna element 32 is connected to the ground end piece 27. In another embodiment, however, one of the ends of the antenna element 41 may be connected to the ground end piece 27, and the extended end E4 of the antenna element 32 may be connected to the feed end piece 26.

In the high-frequency antenna according to at least one of the foregoing embodiments or examples, the first angle range in which the first antenna element extends deviates from the second angle range in which the second antenna element extends in the circumferential direction. Furthermore, the second antenna element is arranged away from the window compared to the first antenna element, and is arranged on the outer peripheral side with respect to the first antenna element. Furthermore, the first relaying portion extends from the first antenna element toward the side away from the window, and the second relaying portion extends toward the outer peripheral side, from the first relaying portion to the second antenna element. It is thus possible to provide a high-frequency antenna that can secure symmetry of plasma density generated in the processing space, even if the antenna is a small-diameter antenna.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high-frequency antenna provided on an outer surface of a window which is formed in a chamber, the high-frequency antenna being configured to generate an induction electric field in a processing space inside the chamber when a high-frequency current flows, and configured to generate plasma in the processing space by the induction electric field, the high-frequency antenna comprising:
 a first antenna element that extends along a circumferential direction over a first angle range in the circumferential direction;
 a second antenna element that extends along the circumferential direction over a second angle range which deviates from the first angle range in the circumferential direction, and that is arranged away from the window compared to the first antenna element and arranged on an outer peripheral side with respect to the first antenna element; and
 a first relaying portion that extends from the first antenna element toward a side away from the window;
 a second relaying portion that extends toward the outer peripheral side from the first relaying portion to the second antenna element, and that is arranged away from the window compared to the first antenna element.

2. The high-frequency antenna according to claim 1, wherein
 the first angle range is larger than the second angle range.

3. The high-frequency antenna according to claim 1, wherein
 a part of the second angle range overlaps the first angle range.

4. The high-frequency antenna according to claim 3, wherein
 the second antenna element comprises:
 a first extending portion that extends in a region within the second angle range and out of the first angle range, and that is connected to the second relaying portion; and
 a second extending portion that extends in a region in the second angle range and overlapping the first angle range, and that is away from the second relaying portion compared to the first extending portion in the circumferential direction.

5. The high-frequency antenna according to claim 1, wherein the first antenna element includes a first extended end and a second extended end located on an opposite side of the first extended end, and is connected to the first relaying portion at the second extended end, the second antenna element includes a third extended end and a fourth extended end located on an opposite side of the third extended end, and is connected to the second relaying portion at the third extended end, and an angle position of the second extended end of the first antenna element corresponds to an angle position of each of the first relaying portion, the second relaying portion, and the third extended end of the second antenna element in the circumferential direction.

6. A plasma processing device comprising:

the high-frequency antenna according to claim 1;

the chamber including the window in which the high-frequency antenna is provided on the outer surface thereof, and in which the processing space is formed therein;

a gas supply source configured to supply a gas to the processing space; and an electric power source configured to supply high-frequency electric power to the high-frequency antenna so as to cause the high-frequency current to flow in the high-frequency antenna, thereby generating the induction electric field in the processing space, and configured to generate the plasma in the processing space by generating the induction electric field in the processing space while the processing space is being supplied with the gas.

\* \* \* \* \*